United States Patent
Hung

(10) Patent No.: US 10,058,000 B2
(45) Date of Patent: Aug. 21, 2018

(54) WATERPROOF STRUCTURE FOR CASING OF ELECTRONIC DEVICE

(71) Applicant: CAL-COMP BIG DATA, INC., New Taipei (TW)

(72) Inventor: Ming-Hua Hung, New Taipei (TW)

(73) Assignee: CAL-COMP BIG DATA, INC., New Taipei (TW)

( * ) Notice: Subject to any disclaimer, the term of this patent is extended or adjusted under 35 U.S.C. 154(b) by 19 days.

(21) Appl. No.: 15/361,028

(22) Filed: Nov. 24, 2016

(65) Prior Publication Data

US 2018/0124939 A1    May 3, 2018

(30) Foreign Application Priority Data

Oct. 27, 2016   (CN) .......................... 2016 2 1175859

(51) Int. Cl.
*H05K 5/06*     (2006.01)
*H05K 5/00*     (2006.01)

(52) U.S. Cl.
CPC ........... *H05K 5/061* (2013.01); *H05K 5/0008* (2013.01)

(58) Field of Classification Search
USPC ....................................................... 455/575.8
See application file for complete search history.

(56) References Cited

U.S. PATENT DOCUMENTS

| | | | | |
|---|---|---|---|---|
| 5,667,224 A * | 9/1997 | Streckert | ................. | F16J 15/52 220/62.11 |
| 5,845,803 A * | 12/1998 | Saito | ........................ | H05K 5/06 220/222 |
| 9,448,585 B2 * | 9/2016 | Cheng | ................... | G06F 1/1613 |
| 2006/0267293 A1 * | 11/2006 | Hazel | ..................... | F16J 15/061 277/637 |
| 2011/0097227 A1 * | 4/2011 | Cai | ........................ | F04B 43/026 417/472 |
| 2011/0140375 A1 * | 6/2011 | Sasaki | .................... | F16J 15/104 277/628 |
| 2013/0258681 A1 * | 10/2013 | Wu | ........................ | F21V 31/005 362/374 |
| 2014/0206420 A1 * | 7/2014 | Neichi | ................ | H04M 1/0249 455/575.8 |
| 2016/0113136 A1 * | 4/2016 | Shin | ...................... | G06F 1/1626 361/679.01 |
| 2017/0223245 A1 * | 8/2017 | Park | ..................... | H04N 5/2254 |

\* cited by examiner

*Primary Examiner* — Edward Urban
*Assistant Examiner* — Ralph H Justus
(74) *Attorney, Agent, or Firm* — Chun-Ming Shih; HDLS IPR Services

(57) ABSTRACT

A waterproof structure for a casing of an electronic device includes: a first casing member, having a first casing portion, a first side portion surrounding the first casing portion, and a first peg disposed in the first casing portion; a second casing member, having a second casing portion, a second side portion surrounding the second casing portion, and a second pegs disposed in the second casing portion and configured to be corresponsive to the first peg; a waterproof member, having a ring portion and a packing portion integrally coupled with each other, and the ring portion being surrounded continuously by the first and second side portions and clamped between the first and second side portions, and the packing portion being disposed between the first and second pegs; and plural locking elements, passing into the first and second pegs to combine with the first and second casing members respectively.

8 Claims, 3 Drawing Sheets

WATERPROOF STRUCTURE FOR CASING OF ELECTRONIC DEVICE

FIELD OF THE INVENTION

This disclosure relates to a waterproof member, and more particularly to a waterproof structure for a casing of an electronic device.

BACKGROUND OF THE INVENTION

Waterproof is one of the important factors for a design of 3C electronic devices or products and allows users to operate the 3C electronic devices or products in different environmental conditions. In particular, it is necessary to have the waterproof effect on a casing of the 3C electronic devices or products. In the waterproof design of the conventional devices or products of this sort, the casing generally has a waterproof ring installed at a joint of a casing member, and the waterproof ring is packed while connecting the casing member with the casing to achieve the sealing and water-resisting effects.

However, the casing of the aforementioned devices or products is generally coupled by a screwing element such as a screw, so that the casing needs a screw hole to lock the screw, and a gap is naturally formed at the position of the screw hole. As a result, the original waterproof effect no longer exists, and it is necessary to add a waterproof ring to each screw hole in order to have the waterproof effect. Obviously, such arrangement is inconvenient to the assembling, and the waterproof ring may be missing due negligence in the assembling operation, and the devices or products may lose its waterproof effect, and the defective rate may rise.

In addition, the waterproof ring is compressed when the casing member compresses the waterproof ring, and there will be no room for further compression or deformation. As a result, the deformed waterproof ring may split open the casing members to produce a gap easily, and the waterproof effect may be affected adversely.

In view of the aforementioned drawbacks of the prior art, the discloser of this disclosure based on years of experience in the related industry to conduct extensive research, and finally designed a waterproof structure for a casing of an electronic device to overcome the drawbacks of the prior art.

SUMMARY OF THE INVENTION

Therefore, it is a primary objective of the present invention to provide a waterproof structure for a casing of an electronic device, and its design with an integrally formed waterproof ring has the effects of reducing the quantity of the components, simplifying the assembling process, lowering the assembling time, and improving the yield rate of the product.

Another objective of this disclosure is to provide a waterproof structure for a casing of an electronic device to improve the waterproof effect and enhances the waterproof level of the casing.

To achieve the aforementioned and other objectives, this disclosure provides a waterproof structure for a casing of an electronic device, comprising: a first casing member, a second casing member, a waterproof member, and a plurality of locking elements, wherein the first casing member has a first casing portion, a first side portion surrounding the periphery of the first casing portion, and a plurality of first pegs disposed in and protruded from the first casing portion; the second casing member is engaged with the first casing member and has a second casing portion, a second side portion surrounding the periphery of the second casing portion, and a plurality of second pegs disposed in and protruded from the second casing portion and configured to be corresponsive to the first pegs respectively; and the waterproof member has a ring portion, and a plurality of packing portions formed by integrally coupling the ring portion, and the ring portion is surrounded continuously by the first and second side portions and clamped between the first and second side portions, and the packing portions is disposed between the first and second pegs respectively; and the locking elements pass into the first and second pegs to combine the first and second casing members.

To achieve the aforementioned and other objectives, this disclosure also provides a waterproof structure for a casing of an electronic device, further comprising a first accommodating area and a second accommodating area defined between the first and second casing members respectively, and the waterproof member is accommodated in the first and second accommodating areas. The first and second accommodating areas have a first interference slot and a second interference slot respectively and concavely formed on the first and second side portions and disposed opposite to the ring portion, and the first and second interference slots are recessed into a width greater than the corresponsive width of the ring portion. In addition, each of the packing portions has an outer sleeve and an inner sleeve, and the outer sleeve with an external diameter corresponsive to each first peg is sheathed on each respective first peg, and the inner sleeve is extended inwardly from the internal periphery of the outer sleeve.

DESCRIPTION OF THE PREFERRED EMBODIMENTS

The technical contents of the present invention will become apparent with the detailed description of preferred embodiments accompanied with the illustration of related drawings as follows. It is noteworthy that the preferred embodiments are provided for illustrating this disclosure rather than restricting the scope of the disclosure.

Figure 1:
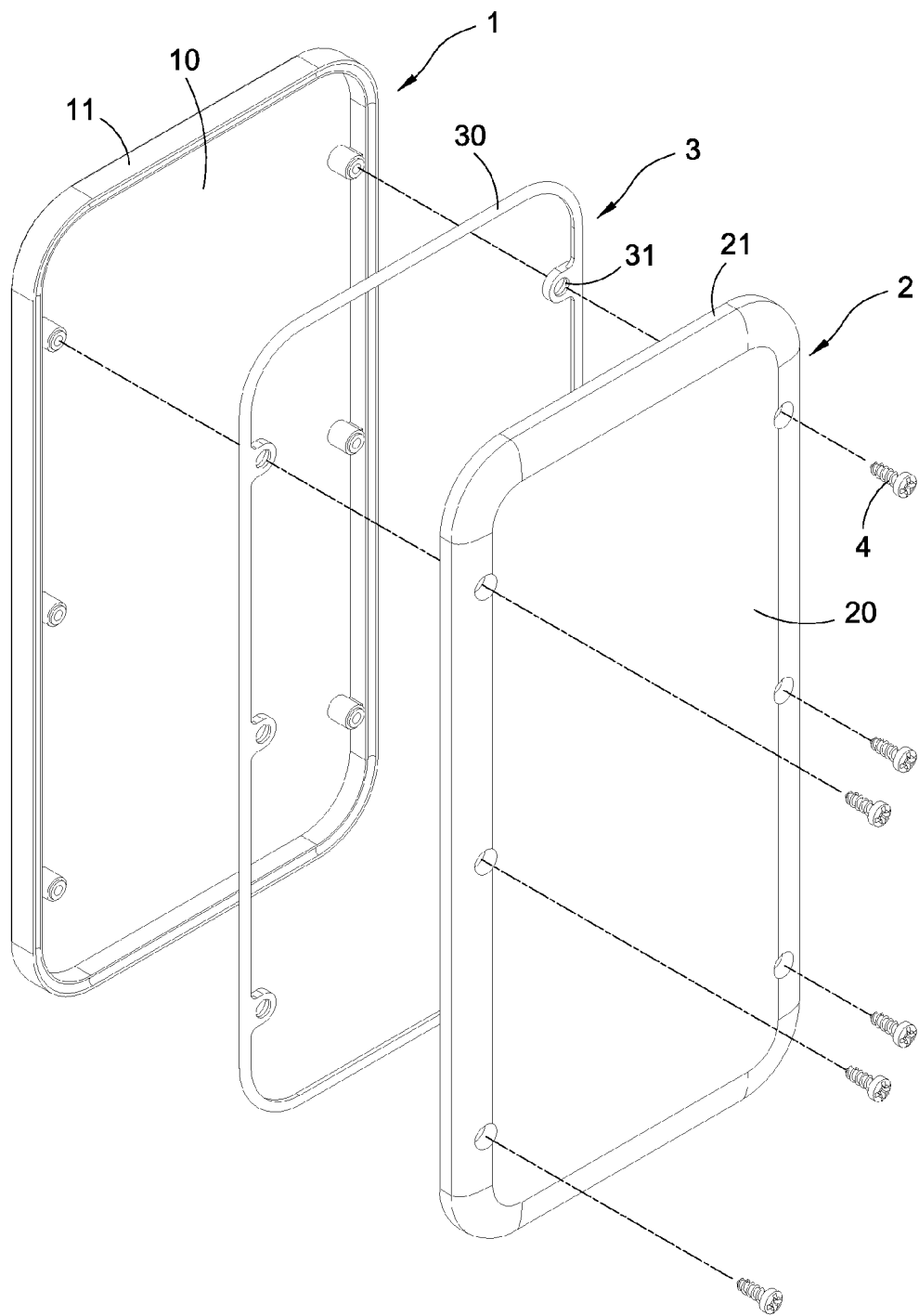
FIG. 1 is an exploded view of this disclosure.

With reference to FIG. 1 for an exploded view of this disclosure, this disclosure provides a waterproof structure for a casing of an electronic device, which is applicable for a casing of various electronic devices, products or related peripherals such as the casing of a mobile phone, a flat PC or a controller. The waterproof structure for a casing of an electronic device comprises a first casing member 1, a second casing member 2, a waterproof member 3, and a plurality of locking elements 4.

Figure 2:
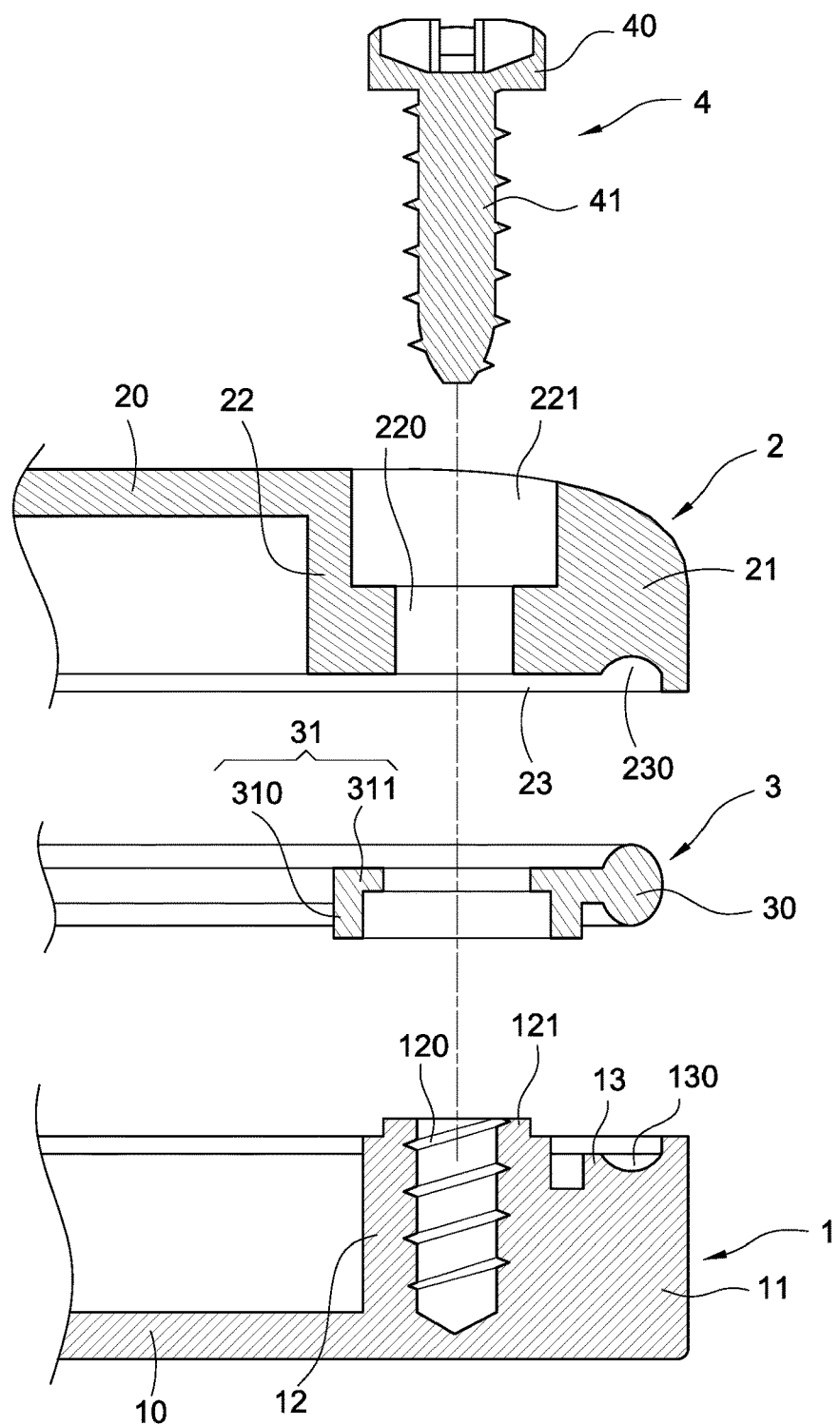
FIG. 2 is a partial exploded view of this disclosure.
Figure 3:
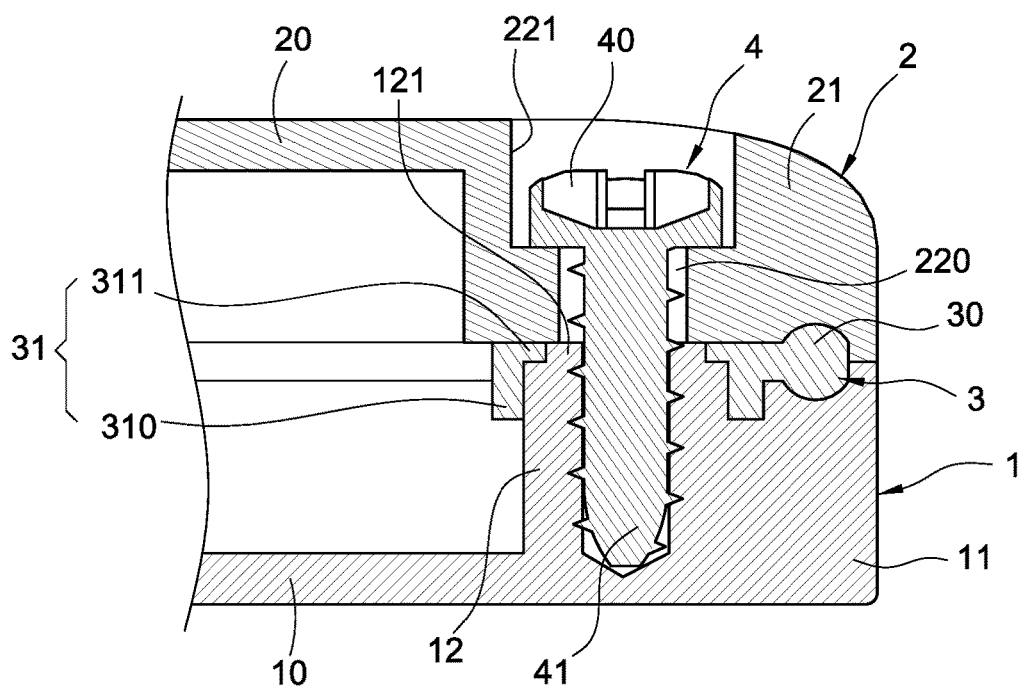
FIG. 3 is a partial sectional view of this disclosure.

The first casing member 1 may be a panel or an upper casing of a general 3C product and has a first casing portion 10, a first side portion 11 surrounding the periphery of the first casing portion 10 and having a window (not shown in the figure) depending on the requirement of the 3C product, a plurality of first pegs 12 disposed in and protruded from the first casing portion 10, and each first peg 12 is generally near the inner side of the first side portion 11. In this embodiment, each first peg 12 is coupled to the inner side of the first side portion 11 (as shown in FIG. 2 or 3).

The second casing member 2 may be a back cover of a general 3C product and assembled with the first casing member 1, and the second casing member 2 has a second casing portion 20 configured to be corresponsive to the first casing member 1, a second side portion 21 surrounding the periphery of the second casing portion 20, a plurality of second pegs 22 disposed in and protruded from the second casing portion 20, and each second peg 22 being configured to be corresponsive to each respective first peg 12 and generally disposed near an inner side of the second side portion 21. In an embodiment of this disclosure, each second peg 22 is coupled to an inner side of the second side portion 21 (as shown in FIG. 2 or 3).

The waterproof member 3 is installed between the first and second casing members 1, 2 and has a ring portion 30, and a plurality of packing portions 31 formed by integrally coupling the ring portion 30. In other words, the ring portion 30 and each packing portion 31 are integrally formed. For example, the ring portion 30 and the packing portion 31 are integrally formed and made of a rubber material, so that the waterproof member 3 can be assembled onto the first and second casing members 1, 2 at a time to simplify the assembling process and achieve the effects of reducing the manufacturing time and improving the yield rate of the product. Specifically, the ring portion 30 is surrounded continuously by the first and second side portions 11, 21 of the first and second casing members 1, 2, so that the ring portion 30 can be clamped between the first and second side portions 11, 21 when the first and second casing members 1, 2 are engaged with each other, and each packing portion 31 is disposed between the each first and second pegs 12, 22. In an embodiment of this disclosure, each packing portion 31 is disposed at the internal periphery of the ring portion 31.

The locking elements 4 are passed into the first and second pegs 12, 22. In an embodiment of this disclosure, each first peg 12 has a screw hole 120, and each second peg 22 has a through hole 220, and a recess 221 formed on an outer side of the second peg 222 and communicated with the through hole 220, and each locking element 4 may be a screw or a bolt and has a screw head 40, and a screw rod 41 extended from the screw head 40, and the screw rod 41 is passed through the through hole 220 and locked into the screw hole 120 and also provided for accommodating the screw head 40 into the recess 221. The first and second casing members 1, 2 are engaged with each other by the screw elements 4.

With reference to FIGS. 2 and 3, the waterproof structure of this disclosure further comprises a first accommodating area 13 and a second accommodating area 23 defined between the first and second casing members 1, 2 and serving as a space for installing the waterproof member 3 after the first and second casing members 1, 2 are engaged with each other, and the first and second accommodating areas 13, 23 have a first interference slot 130 and a second interference slot 230 respectively and concavely formed on the first and second side portions 11, 21 and disposed opposite to the ring portion 30 of the waterproof member 3, and the first and second interference slots 130, 230 are recessed into a width greater than the corresponsive width of the ring portion 30, so that the ring portion 30 may deform in a widthwise direction of the first and second interference slots 130, 230 when the first and second casing members 1, 2 are engaged with each other to compress the ring portion 30. Such arrangement can prevent the situation of splitting open the first and second casing members 1, 2 and producing a gap when the deformation position of the ring portion 30 cannot be controlled. Further, each packing portion 31 of the waterproof member 3 of this disclosure may have an outer sleeve 310 and an inner sleeve 311, and the outer sleeve 310 with an external diameter corresponsive to each first peg 12 is sheathed on the first peg 12, and the inner sleeve 311 is extended inwardly from an inner periphery of the outer sleeve 310, and a tapered neck portion 121 is formed at an upper end of each first peg 12, and the inner sleeve 311 with an external diameter corresponsive to the neck portion 121 is sheathed on the neck portion 121, and the outer sleeve 310 has a thickness greater than the thickness of the inner sleeve 311. The packing portion 31 and the first peg 12 constitute a stepped structure which can further improve the waterproof effect of the casing and enhance the waterproof level of the casing.

With the aforementioned assembly, the waterproof structure for a casing of an electronic device of this disclosure is achieved.

In summation of the description above, this disclosure discloses an innovative product capable of achieving the expected effects and overcoming the drawbacks of the prior art, and complies with the patent application requirements, and is thus filed for patent application.

While the invention has been described by means of specific embodiments, numerous modifications and variations could be made thereto by those skilled in the art without departing from the scope and spirit of the invention set forth in the claims.

What is claimed is:

1. A waterproof structure for a casing of an electronic device, comprising:
   a first casing member, having a first casing portion, a first side portion surrounding the periphery of the first casing portion, and a plurality of first pegs disposed in and protruded from the first casing portion;
   a second casing member, assembled with the first casing member, and having a second casing portion, a second side portion surrounding the periphery of the second casing portion, a plurality of second pegs disposed in and protruded from the second casing portion, and configured to be corresponsive to the first pegs respectively;
   a waterproof member, having a ring portion, and a plurality of packing portions formed by integrally coupling the ring portion, and the ring portion being surrounded continuously by the first and second side portions and clamped between the first and second side portions, and the packing portions being disposed between the first and second pegs respectively; and
   a plurality of locking elements, passing into the first and second pegs to combine the first and second casing members,
   wherein a first accommodating area and a second accommodating area are defined between the first and second casing members, and the waterproof member is accommodated in the first and second accommodating areas;
   wherein the first and second accommodating areas have a first interference slot and a second interference slot respectively and concavely formed on the first and second side portions and disposed around the ring portion, and each of the first and second interference slots is recessed into a width greater than the corresponsive width of the ring portion, so that the ring portion deforms in a widthwise direction of each of the first and second interference slots when the first and second casing members are engaged with each other to compress the ring portion.

2. The waterproof structure for a casing of an electronic device according to claim 1, wherein the first pegs are coupled to an inner side of the first side portion.

3. The waterproof structure for a casing of an electronic device according to claim 1, wherein the second pegs are coupled to an inner side of the second side portion.

4. The waterproof structure for a casing of an electronic device according to claim 1, wherein the waterproof member is made of a rubber material and integrally formed.

5. The waterproof structure for a casing of an electronic device according to claim 1, wherein the packing portions are disposed at the internal periphery of the ring portion.

6. The waterproof structure for a casing of an electronic device according to claim 1, wherein each of the packing portions has an outer sleeve and an inner sleeve, and the outer sleeve with an external diameter corresponsive to each first peg is sheathed on each respective first peg, and the inner sleeve is extended inwardly from the internal periphery of the outer sleeve.

7. The waterproof structure for a casing of an electronic device according to claim 6, wherein each first peg has a tapered neck portion formed at an upper end of the first peg, and the inner sleeve having an external diameter corresponsive to the neck portion is sheathed on the neck portion.

8. The waterproof structure for a casing of an electronic device according to claim 6, wherein the outer sleeve has a thickness greater than the thickness of the inner sleeve.

* * * * *